US012051435B2

(12) United States Patent
Cengarle et al.

(10) Patent No.: US 12,051,435 B2
(45) Date of Patent: *Jul. 30, 2024

(54) AUDIO DE-ESSER INDEPENDENT OF ABSOLUTE SIGNAL LEVEL

(71) Applicants: DOLBY LABORATORIES LICENSING CORPORATION, San Francisco, CA (US); DOLBY INTERNATIONAL AB, Amsterdam Zuidoost (NL)

(72) Inventors: Giulio Cengarle, Barcelona (ES); Antonio Mateos Sole, Barcelona (ES); Brett G. Crockett, Brisbane, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 17/733,397

(22) Filed: Apr. 29, 2022

(65) Prior Publication Data

US 2022/0262387 A1  Aug. 18, 2022

Related U.S. Application Data

(63) Continuation of application No. 16/753,029, filed as application No. PCT/US2018/053988 on Oct. 2, 2018, now Pat. No. 11,322,170.

(Continued)

(30) Foreign Application Priority Data

Oct. 2, 2017 (ES) ............................... ES201731174
Dec. 4, 2017 (EP) .................................... 17205121

(51) Int. Cl.
*G10L 21/0264* (2013.01)
*G10L 21/0232* (2013.01)
*H03G 3/30* (2006.01)

(52) U.S. Cl.
CPC ...... *G10L 21/0232* (2013.01); *G10L 21/0264* (2013.01); *H03G 3/3005* (2013.01)

(58) Field of Classification Search
CPC . G06F 3/165; G10L 21/0232; G10L 21/0264; G10L 21/0364; H03G 5/165; H03G 9/025
(Continued)

(56) References Cited

U.S. PATENT DOCUMENTS 8,223,990 B1  7/2012  King
8,229,106 B2  7/2012  Greiss
(Continued)

FOREIGN PATENT DOCUMENTS

| CN | 105027541 | 11/2015 |
| CN | 105164918 | 12/2015 |
| WO | 2015035492 | 3/2015 |

OTHER PUBLICATIONS

Kong, Ying-Yee et al "Classification of Fricative Consonants for Speech Enhancement in Hearing Devices" www.plosone.org, Apr. 2014, vol. 9, Issue 4, pp. 1-8.
(Continued)

*Primary Examiner* — George C Monikang (57) ABSTRACT

Methods, systems, and computer program products of automatic de-essing are disclosed. An automatic de-esser can be used without manually setting parameters and can perform reliable sibilance detection and reduction regardless of absolute signal level, singer gender and other extraneous factors. An audio processing device divides input audio signals into buffers each containing a number of samples, the buffers overlapping one another. The audio processing device transforms each buffer from the time domain into the frequency domain and implements de-essing as a multi-band compressor that only acts on a designated sibilance band. The audio processing device determines an amount of attenuation in the sibilance band based on comparison of energy level in (Continued)

sibilance band of a buffer to broadband energy level in a previous buffer. The amount of attenuation is also determined based on a zero-crossing rate, as well as a slope and onset of a compression curve.

15 Claims, 6 Drawing Sheets

Related U.S. Application Data (60) Provisional application No. 62/594,253, filed on Dec. 4, 2017.

(58) Field of Classification Search
USPC .................. 381/98, 104, 106–107, 119
See application file for complete search history.

(56) References Cited

U.S. PATENT DOCUMENTS

| | | |
|---|---|---|
| 8,831,958 B2 | 9/2014 | Lee |
| 9,066,177 B2 | 6/2015 | Sandgren |
| 9,502,050 B2 | 11/2016 | Buck |
| 2011/0093102 A1* | 4/2011 | Aichner ............... H04M 9/082 |
| | | 381/66 |
| 2012/0243702 A1 | 9/2012 | Sandgren |
| 2013/0051582 A1* | 2/2013 | Kropfitsch ............ H03F 1/56 |
| | | 330/144 |
| 2014/0064519 A1 | 3/2014 | Silfvast |
| 2015/0066820 A1 | 3/2015 | Kapur |
| 2015/0348562 A1 | 12/2015 | Krishnaswamy |
| 2016/0189707 A1 | 6/2016 | Donjon |
| 2017/0011753 A1 | 1/2017 | Herbig |

OTHER PUBLICATIONS

Kyriakides, A. et al "Isolated Word Endpoint Detection Using Time-Frequency Variance Kernels" IEEE, Signals, Systems and Computers (Asilomar), 2011 Conference Record of the Forty Fifth Asilomar Conference on Nov. 2011, pp. 585-589. 2011, pp. 585.

Stranik, A. et al "Spectral Approximations for Sibilant Classification" Sep. 2011, IEEE.

Wolters, M. et al "Adaptive Algorithm for Detecting and Reducing Sibilants in Recorded Speech" Proc. AES 104th Convention, May 16, 1998.

* cited by examiner

AUDIO DE-ESSER INDEPENDENT OF ABSOLUTE SIGNAL LEVEL

CROSS-REFERENCE TO RELATED APPLICATIONS

This patent application is a continuation of U.S. patent application Ser. No. 16/753,029, filed on Apr. 2, 2020, which is a National Phase entry under 35 U.S.C. § 371 of PCT Application No. PCT/US2018/053988, filed on Oct. 2, 2018, which claims the benefit of priority from Spanish Patent Application No. P201731174, filed on Oct. 2, 2017; U.S. Provisional Patent Application No. 62/594,253, filed on Dec. 4, 2017; and European Patent Application No. 17205121.1 filed on Dec. 4, 2017, each one incorporated by reference in its entirety.

TECHNICAL FIELD

This disclosure relates generally to audio signal processing.

BACKGROUND

Vocals are one of the most frequent and important musical sources. When sibilance, e.g., s, z, or sh, is present in sung or spoken voice, it is often emphasized by recording equipment. The emphasis may result in noticeable and unpleasant sibilance levels. De-essers can be used to reduce the signal level in the presence of sibilance. De-essers can act as compressors driven by a side-chain signal that emphasizes the sibilance, e.g. a band-pass filter in the high frequency range, in order to trigger the gain reduction. In conventional de-essers, gain reduction depends therefore on the settings of the side-chain filter and on an absolute threshold, e.g. the amount of sibilance level above which gain reduction is applied. These parameters are usually set manually by sound engineers and change from session to session.

SUMMARY

Techniques of automatic de-essing are disclosed. An automatic de-esser can be used without manually setting parameters and can perform reliable sibilance detection and reduction regardless of absolute signal level, singer gender and other extraneous factors. An audio processing device divides input audio signals into buffers each containing a number of samples, the buffers overlapping one another. The audio processing device transforms each buffer from the time domain into the frequency domain and implements de-essing as a multi-band compressor that only acts on a designated sibilance band. The audio processing device determines an amount of attenuation in the sibilance band based on comparison of energy level in sibilance band of a buffer to broadband energy level in a previous buffer. The amount of attenuation is also determined based on a zero-crossing rate, as well as a slope and onset of a compression curve.

The features described in this specification can achieve one or more advantages over conventional de-essing technology. The disclosed techniques can de-ess sibilance present in soft part of a performance. In general, sibilance can be present in both loud and soft parts of a performance. Conventional manual methods are usually set to act on the loud sibilance, and when presented with soft sibilance, conventional de-essers either do not act, or require manual intervention to tweak the threshold parameter over time. By comparison, the disclosed techniques automatically detect and process the soft sibilance.

The disclosed techniques are independent from level of the audio signals being processed. Conventional de-essing techniques may act differently on exactly the same performance after overall level of the input signal changes, because they are based on absolute parameters. The disclosed techniques, being based on relative comparisons, will perform consistent de-essing even after signal level change.

The details of one or more implementations of the disclosed subject matter are set forth in the accompanying drawings and the description below. Other features, aspects and advantages of the disclosed subject matter will become apparent from the description, the drawings and the claims.

BRIEF DESCRIPTION OF THE DRAWINGS

Like reference symbols in the various drawings indicate like elements.

DETAILED DESCRIPTION

Example Device

Figure 1:
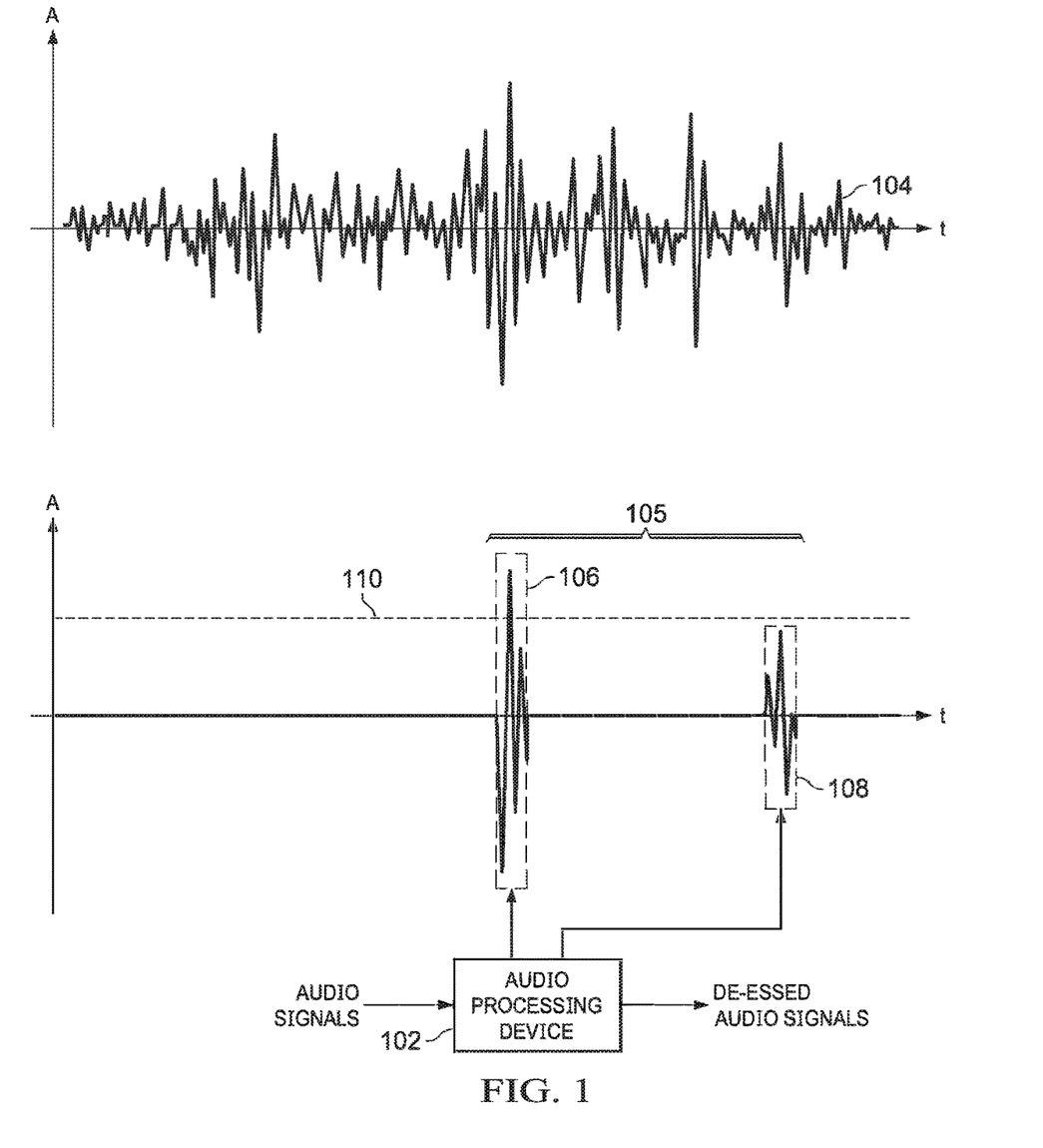
FIG. 1 is a diagram illustrating operations of an example audio processing device implementing a de-esser.

FIG. 1 is a diagram illustrating operations of an example audio processing device 102 implementing a de-esser. The audio processing device can be a computing device including one or more processors. The audio processing device 102 receives audio signals 104 from a recording device, e.g., a microphone. A representation of the audio signals 104 is shown in FIG. 1. The horizontal axis represents time. The vertical axis represents amplitude.

The audio signals 104 includes sections where sibilant sounds are present. For example, sections 106 and 108 include sounds such as "s," "c" or "sh." The sibilant sounds may have amplitudes as indicated in FIG. 1. Due to characteristics of the recording device, the sibilant sounds may appear prominent, excessive and annoying to a listener. A conventional de-esser can include a compressor driven by a side-chain signal that emphasizes the sibilance, e.g., a band-pass filter in the 5 kHz-10 kHz frequency range in order to trigger a gain reduction. The amount of gain reduction depends on settings of the side-chain filter and on an absolute threshold 110. The conventional de-esser can apply gain reduction in response to determining that the amount of sibilance level is above the threshold 110. The side-chain settings and the threshold 110 are set manually by sound engineers and change from session to session.

In the example shown, de-essing is applied based on side-chain signals 105 of the audio signals 104. In the side-chain signals 105, sibilance is emphasized by removing other bands. In some implementations, sibilance is emphasized by boosting. The waveform of the side-chain signals 105 in FIG. 1 is a rough representation of the side-chain signals corresponding to the audio signals 104 in time domain. In the example shown, the sibilance sounds in the section 106 have levels above the threshold 110, while the sibilance sounds in the section 108 have levels below the threshold 110. Accordingly, a conventional de-esser may apply de-essing to the sibilant sounds in the section 106 only, and not apply de-essing to the sibilance sounds in the section 108.

The audio processing device 102 is configured to perform de-essing independent of the absolute signal level. Accordingly, the audio processing device 102 can apply de-essing to sibilance sounds in both the section 106 and the section 108. More generally, the audio processing device 102 can apply de-essing in recordings where the input level is unknown and may change significantly over time. The audio processing device 102 can apply de-essing within a same performance on both loud and soft parts, without the risk of over-processing the louder parts or not acting on softer parts.

The audio processing device 102 performs de-essing by splitting the audio signal 104 into a series of buffers. The audio processing device 102 transforms each buffer from the time domain into the frequency domain. The audio processing device 102 implements de-essing as a multi-band compressor, which only acts on a designated sibilance band. The audio processing device 102 determines the amount of attenuation in the sibilance band based on the following factors.

First, the audio processing device 102 determines the amount of excess sibilance based on the energy in the sibilance band of a buffer compared to the broadband energy in a previous buffer. The comparison avoids engaging attenuation when the level in the sibilance band is small, in a relative way. Second, the audio processing device 102 determines the amount of attenuation based on a slope and onset of a compression curve. These factors allow a user to control an amount of de-essing. Third, the audio processing device 102 modifies the amount of attenuation based on a zero-crossing rate (ZCR). The ZCR can help differentiating sibilance sounds from other sounds in the same frequency band.

The audio processing device 102 can provide the de-essed audio signals 104 to a consuming device, e.g., a storage device, a streaming server or a playback device for storage, distribution, and playback. In the de-essed audio signals, sibilant sounds at all levels can be attenuated. The attenuation need not affect frequencies out of the sibilance frequency band, as conventional de-essers sometimes do.

The audio processing device 102 can apply de-essing to multichannel signals, where each channel is processed independently. In some implementations, the audio processing device 102 processes all the channels equally, by linking side-chain signals, e.g. using the sum of side-chain signals from each channel. Additional details of the de-essing techniques are provided below.

Example Signal Processing

Figure 2:
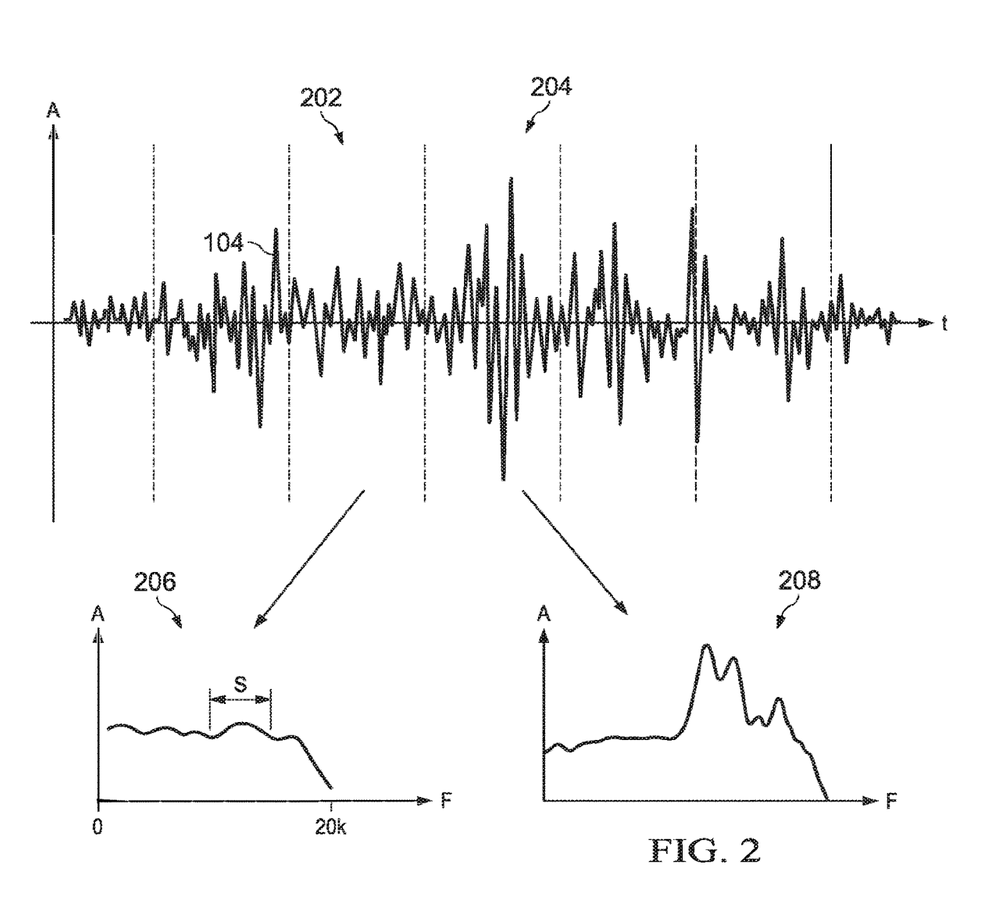
FIG. 2 is a diagram illustrating example techniques for splitting audio signals for de-essing.

FIG. 2 is a diagram illustrating example techniques for splitting audio signals for de-essing. An audio processing device, e.g., the audio processing device 102 of FIG. 1, receives, as input, audio signals 104. The audio signals 104 are in time domain and contains a series of samples. Sample rate of the audio signals can be, for example, 44.1 kHz or 192 kHz. The horizontal axis in the audio signals 104 indicates time. The vertical axis in the audio signals 104 indicates amplitude.

The audio processing device divides the audio signals 104 into a series of buffers including, for example, buffers 202 and 204. Each buffer can include a set of samples, e.g., 2048 samples that are adjacent to each other in time. In the example shown, the buffers in the series do not overlap. In various implementations, the buffers in the series can overlap by a configurable amount. For example, the buffers 202 and 204 can have a 50 percent overlap, where 50% of the samples in the buffer 202, e.g., the second half, are included in the buffer 204, e.g., as the first half. When overlapping buffers, the audio processing device can apply a window to two neighboring buffers. The window can include a fade-out and a fade-in. The window is a perfect reconstruction where, if the overlapping buffers are added together without additional processing, the original audio signals 104 can be reconstructed perfectly.

The audio processing device transforms each buffer into frequency domain. For example, the audio processing device transforms the buffers 202 and 204 into frequency domain buffers 206 and 208, respectively. As shown in FIG. 2, the horizontal axes of frequency domain buffers 206 and 208 indicate frequency, e.g., from zero Hz to 20 kHz. The vertical axes indicate amplitude. The transform can be a Fast Fourier Transform. The audio processing device provides the result of transform to a next stage of processing. For convenience, each of the frequency domain buffers 206 and 208 is referred to as inFFT(n), where n is an index of the particular buffer in the series and inFFT(n) is the frequency domain representation of the n-th buffer in the input audio signals.

Figure 3:
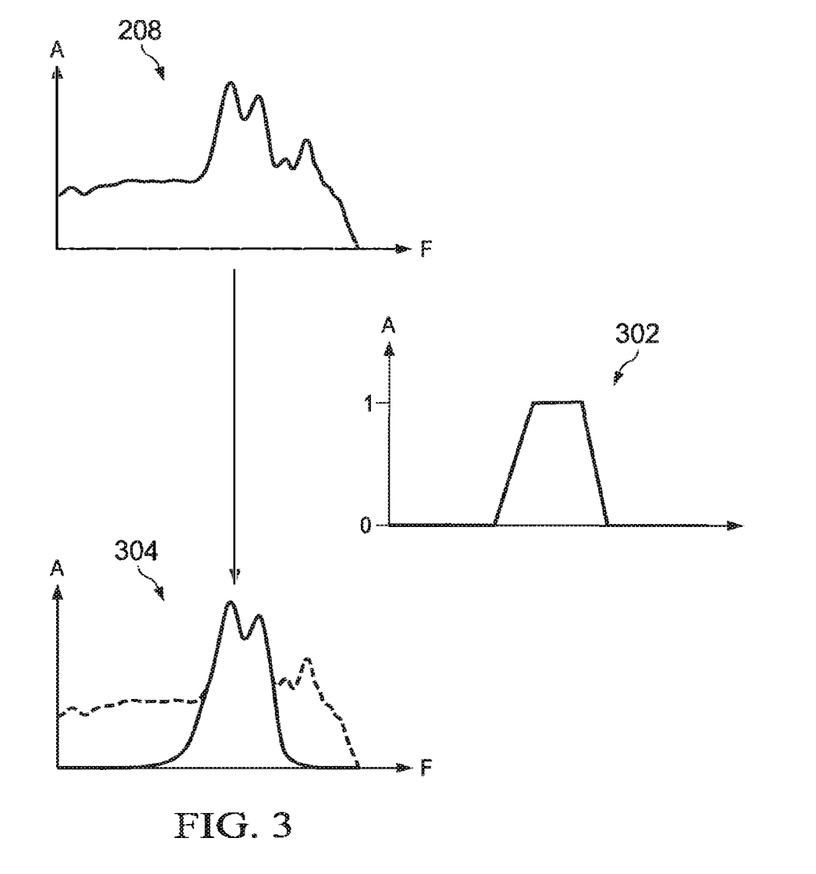
FIG. 3 is a diagram illustrating example techniques of energy calculation.

FIG. 3 is a diagram illustrating example techniques of energy calculation. An audio processing device, e.g., the audio processing device 102 of FIG. 1, determines a side-chain filter 302. The side-chain filter has a unit magnitude, e.g., magnitude one, inside a designated sibilance band, e.g., 5 kHz through 10 kHz or 6 kHz through 16 kHz. The side-chain filter 302 can have a magnitude of zero outside of the designated sibilance band. The side-chain filter 302 can have a ramp adjacent to the sibilance band, e.g., a ramp of ⅓ octave. For convenience and simplicity, the side-chain filter 302 is referred to as SCFilter.

The audio processing device multiplies each of the frequency domain buffers to the side-chain filter 302 to determine a respective side-chain buffer. For example, the audio processing can determine a side-chain buffer 304 by multiplying the inFFT of the frequency domain buffer 208 with the side-chain filter 302. By applying the side-chain filter 302, signals outside of the designated sibilance band are filtered out. For convenience and simplicity, the side-chain buffer 304 is referred to as scFFT(n), where n is an index of the frequency domain buffer 208 in the series and scFFT(n) is the n-th side-chain buffer. Generally, the audio processing device can determine the side-chain buffer 304 using Equation 1 below.

$$scFFT(n) = inFFT(n) * SCFilter, \quad (1)$$

where SCFilter is the side-chain filter 302, and the symbol * denotes element-wise product of two vectors having a same number of, e.g., 2048, samples as elements.

The audio processing device determines a respective envelope Env(n) of signal energy for each buffer. The signal energy can be a sum of squares of the amplitudes of samples in the respective buffer; the envelope can be the signal energy smoothed with a first order low-pass filter, with different time constants depending on whether the signals are in an attack phase or a release phase. The audio processing device can determine the time constants as follows.

If Energy(inFFT(n))>Env(inFFT(n−1)), t=tAttack;
If Energy(inFFT(n))<=Env(inFFT(n−1)), t=tRelease,
where n is an index, inFFT(n) is the n-th buffer of input audio signals in frequency domain, Energy(inFFT(n)) is the energy of the n-th buffer, which is the sum of squares, tAttack is a time constant value corresponding to an attack phase, and tRelease is a time constant value corresponding to a release phase. The audio processing device can then determine the envelope for the n-th buffer Env(inFFT(n)) using Equation 2 below.

$$Env(inFFT(n))=(1-t)*Energy(inFFT(n))+t*Env(inFFT(n-1)) \quad (2)$$

The audio processing device determines a respective energy level EnergySC(scFFT(n)) for each side-chain buffer scFFT(n) by computing a sum of squares of samples in the n-th side-chain buffer scFFT(n).

The audio processing device then determines a respective zero-crossing rate ZCR(n) for each buffer n in the time-domain signal. The values of Env, EnergySC, and ZCR in a time series are plotted in FIG. 4.

Figure 4:
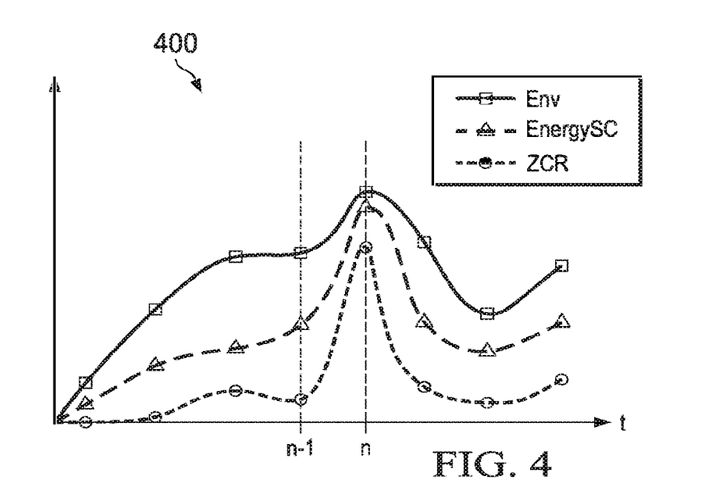
FIG. 4 is a diagram illustrating example de-essing parameters computed from audio signals.

FIG. 4 is a diagram illustrating example de-essing parameters computed from audio signals. The parameters include values of Env, EnergySC, and ZCR, plotted over time, and not to the same vertical scale. The top curve corresponds to the envelopes Env of the buffers of the input signal. The middle curve corresponds to the energy levels of the side-chain buffers. The bottom curve corresponds to the ZCR values of the buffers.

A ratio of an energy level EnergySC of a particular side-chain buffer scFFT(n) over an energy envelope Env of an immediately preceding frequency domain buffer inFFT(n−1) can indicate a likelihood of a sound being sibilance in an attack. A ZCR value can indicate a likelihood that a signal in a sibilance frequency band is indeed sibilance.

The audio processing device, e.g., the audio processing device 102 of FIG. 1, can determine an amount of de-essing in the form of signal gain reduction in each frequency band of multiple frequency bands of the signals. The audio processing device can determine to apply gain reduction in an n-th buffer in response to determining that a first condition and a second condition are satisfied. The audio processing device determines that the first condition is satisfied in response to determining that a ratio between energy level EnergySC(scFFT(n)) for an n-th side-chain buffer and the energy envelope of a previous frequency domain buffer Env(inFFT(n−1)) is above a first threshold Th1. The audio processing device determines that the second condition is satisfied upon determining that the zero-crossing rate ZCR(n) is higher than a second threshold Th2.

Unlike conventional de-essers, the gain reduction implemented by the audio processing device is independent of the absolute signal level. Instead of setting an absolute threshold, audio processing device reduces the gain according to the ratio between sibilant signal and previous audio level. The audio processing device determines an amount of the gain reduction GR that is proportional to the ratio EnergySC(scFFT(n)) over Env(inFFT(n−1)) that is above the first threshold Th1, with a slope k that is fixed or controlled by a user, according to Equation 3 below.

$$GR = k * \left( \frac{EnergySC(scFFT(n))}{Env(inFFT(n-1))} - Th1 \right) \quad (3)$$

The audio processing device applies the gain reduction attack and release time constants, and only acts in the bands where the side chain filter is not zero, in the specified sibilance frequency band.

As shown in FIG. 4, at a time that corresponds to the n-th sample, the audio processing device determines that the ratio of $$\frac{EnergySC(scFFT(n))}{Env(inFFT(n-1))}$$

is above the first threshold Th1, e.g., 70 percent. The ZCR(n) is above the second threshold Th2, e.g., 0.3. The audio processing device can apply gain reduction to the frequencies in the sibilance frequency band in the buffer inFFT(n) in response.

In determining whether the second condition is satisfied, the audio processing device can compare the ZCR values with the second threshold Th2 using a binary comparison that has the effect of an on/off switch in some implementations. In some other implementations, the audio processing device performs a soft comparison. The soft comparison has the effect of modifying gain reduction continuously as a function of ZCR. The soft comparison is described below in additional detail in reference to FIG. 5.

Figure 5:
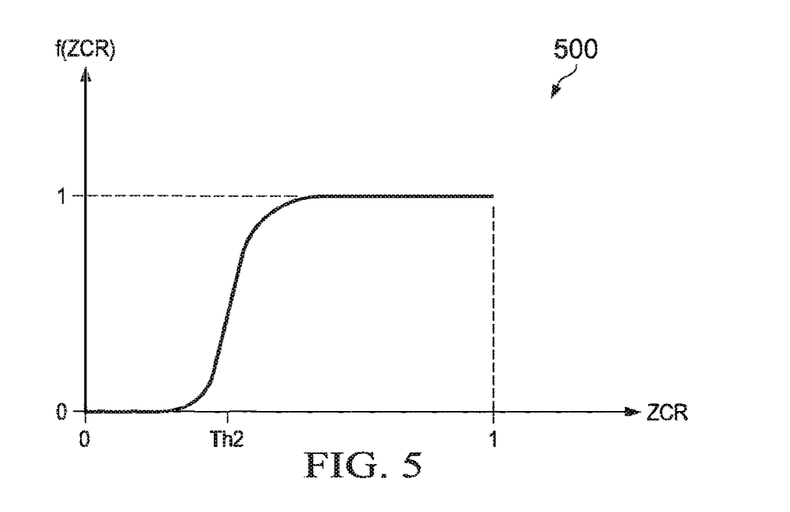
FIG. 5 is a diagram illustrating an example zero-crossing rate function applied in de-essing.

FIG. 5 is a diagram illustrating an example zero-crossing rate function applied in de-essing. The audio processing device computes a ZCR function $f(ZCR)$ as follows. The range of $f(ZCR)$ is between zero and one, as shown in plot 500. The audio processing device can determine a transition range. The transition range can be less than or equal to 0.1 units, e.g., 0.25-0.35, around the second threshold Th2, e.g., 0.3. The function f(ZCR) is a sigmoid function of ZCR, which has a value of zero if the computed ZCR is below the transition range around second threshold Th2, e.g., 0.25. The function has a value of one if the computed ZCR is above the transition range over Th2, e.g., 0.35. The function has a smooth transition in the transition range between zero and one.

Example Processes

Figure 6:
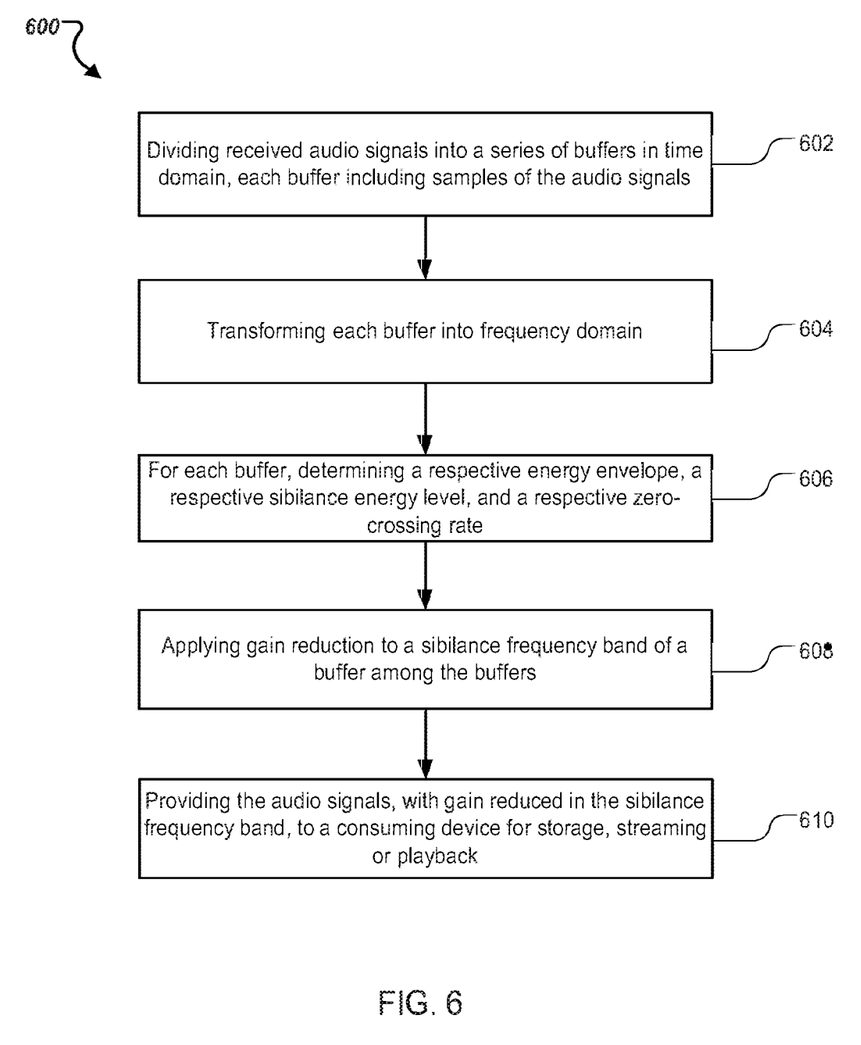
FIG. 6 is a flowchart of an example process of de-essing performed by an audio processing device.

FIG. 6 is a flowchart of an example process 600 of de-essing performed by an audio processing device. The audio processing device, e.g., the audio processing device 102 of FIG. 1, can have multiple components, each components being implemented by one or more computer processors executing computer instructions.

A buffering component of the audio processing device receives audio signals including vocal sounds. The buffering component divides (602) received audio signals into a series of buffers in time domain. Each buffer includes samples of the audio signals. Each pair of neighboring buffers in the series of buffers can have an overlap. The overlap can be any amount that is less than 100 percent. For example, the overlap can be 50 percent.

A transforming component of the audio processing device transforms (604) each buffer into frequency domain. The transformation can be a Fast Fourier Transform (FFT).

A buffer processing component of the audio processing device determines (606), for each buffer, a respective energy envelope, a respective sibilance energy level, and a respective zero-crossing rate. The buffer processing component can determine the energy envelope in time domain or frequency domain. The buffer processing component can determine the sibilance energy level in frequency domain or time domain. The buffer processing component can determine the zero-crossing rate in time domain.

To determine the sibilance energy level, a filter computation module of the audio processing device can determine a side-chain filter in the frequency domain. The side-chain filter can have a magnitude of one in a sibilance frequency band, e.g., 6 kHz to 16 kHz. The side-chain filter can have a magnitude of zero outside of the sibilance frequency band. The side-chain filter can have a ramp adjacent to the sibilance frequency band, e.g., of ⅓ octave. The buffer processing component can determine the respective sibilance energy level for each buffer by applying the side-chain filter to the buffer, e.g., by multiplying the side-chain filter to samples in the buffer in frequency domain, and determining an energy level of the samples after the filtering.

Determining the respective energy envelope for each buffer can include the following operations. The buffer processing component can determine a total energy level of the respective buffer. The buffer processing component can smooth the total energy level into the respective energy envelope by applying a first order low-pass filter having a time constant that is based on whether the buffer is in an attack phase or a release phase. The buffer processing component can determine that the time constant is a first value corresponding to an attack in response to determining that the total energy level of the respective buffer is higher than an energy envelope of an immediate previous buffer. Alternatively, the buffer processing component can determine that the time constant is a second value corresponding to a release in response to determining that the total energy level of the respective buffer is not higher than the energy envelope of the immediate previous buffer. Smoothing the total energy level can include designating a sum of a first product of one minus the time constant and the total energy level and a second product of the time constant and the energy envelope of the immediate previous buffer as an energy envelope of the respective buffer.

A de-essing calculator component of the audio processing can determine whether (a) a ratio between a sibilance energy level of a particular buffer and an energy envelope of an immediate previous buffer satisfies a first threshold, and (b) a zero-crossing rate of the particular buffer satisfies a second threshold. The de-essing calculator component can determine an amount of gain reduction based on the ratio between a sibilance energy level of the buffer and an energy envelope of an immediate previous buffer, wherein the amount is proportional to the ratio above the first threshold.

In response to determine that both (a) and (b) are satisfied, a de-essing component of the audio processing device can apply (608) gain reduction to a sibilance frequency band of the particular buffer. The de-essing component applies the amount of gain reduction based on the calculation from the de-essing calculator component. Applying the gain reduction can include the following operations. The de-essing component determines a function based on the zero-crossing rate and the second threshold. The function, e.g., as described in reference to FIG. 5, can be a sigmoid function of the zero-crossing rate, the function having a transition range in a given domain around the second threshold, a value of zero below the given domain, and a value of one above the given domain. In each frequency band of the buffer, the de-essing component multiplies the amount of gain reduction by value of the function.

In case where the audio signals are multichannel signals, the de-essing component can apply gain reduction for each channel independently. Alternatively, the de-essing component can apply gain reduction equally for the channels using a sum of side-chain signals for each channel.

An output component of the audio processing device then provides (610) the de-essed audio signals, with gain reduced in the sibilance frequency band, to a consuming device for storage, streaming or playback. The consuming device can be a storage device, e.g., flash memory, a server, or an amplifier or loudspeaker.

Example System Architecture

Figure 7:
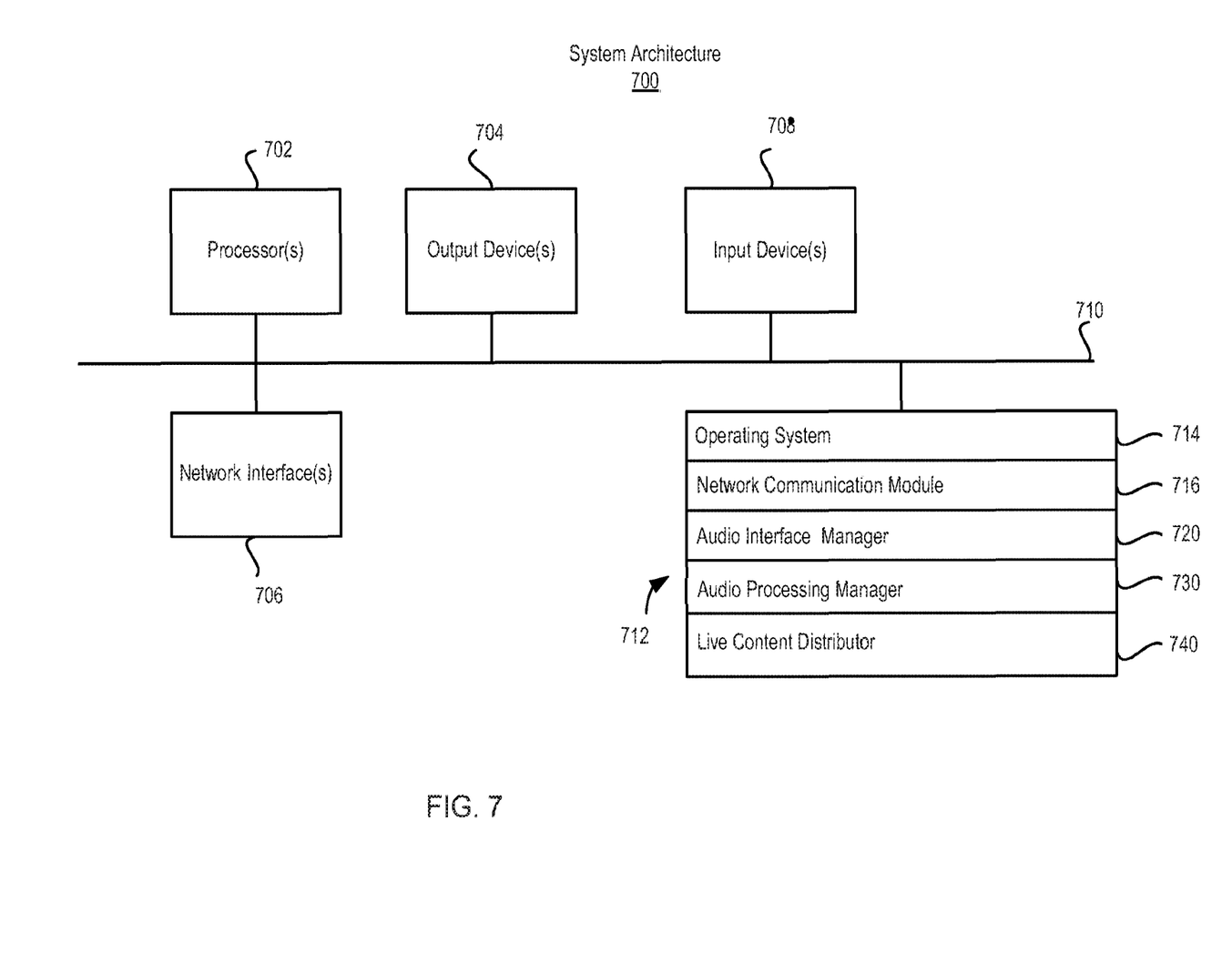
FIG. 7 is a block diagram of an example system architecture for an example computing device implementing the features and operations described in reference to FIGS. 1-6.

FIG. 7 is a block diagram of a system architecture for an example computing device implementing the features and operations described in reference to FIGS. 1-6. The computing device can be the audio processing device 102 of FIG. 1. Other architectures are possible, including architectures with more or fewer components. In some implementations, architecture 700 includes one or more processors 702 (e.g., dual-core Intel® Xeon® Processors), one or more output devices 704 (e.g., LCD), one or more network interfaces 706, one or more input devices 708 (e.g., mouse, keyboard, touch-sensitive display) and one or more computer-readable mediums 712 (e.g., RAM, ROM, SDRAM, hard disk, optical disk, flash memory, etc.). These components can exchange communications and data over one or more communication channels 710 (e.g., buses), which can utilize various hardware and software for facilitating the transfer of data and control signals between components.

The term "computer-readable medium" refers to a medium that participates in providing instructions to processor 702 for execution, including without limitation, non-volatile media (e.g., optical or magnetic disks), volatile media (e.g., memory) and transmission media. Transmission media includes, without limitation, coaxial cables, copper wire and fiber optics.

Computer-readable medium 712 can further include operating system 714 (e.g., a Linux® operating system), network communication module 716, audio interface manager 720, audio processing manager 730 and live content distributor 740. Operating system 714 can be multi-user, multiprocessing, multitasking, multithreading, real time, etc. Operating system 714 performs basic tasks, including but not limited to: recognizing input from and providing output to network interfaces 706 and/or devices 708; keeping track and managing files and directories on computer-readable mediums 712 (e.g., memory or a storage device); controlling peripheral devices; and managing traffic on the one or more communication channels 710. Network communications module 716 includes various components for establishing and maintaining network connections (e.g., software for implementing communication protocols, such as TCP/IP, HTTP, etc.).

Audio interface manager 720 can include computer instructions that, when executed, cause processor 702 to receive audio signals and provide process audio signals to one or more consuming device. Audio processing manager 730 can include computer instructions that, when executed, cause processor 702 to perform de-essing operations as described above in reference to FIGS. 1-6. Live content distributor 740 can include computer instructions that, when executed, cause processor 702 to perform operations of streaming de-essed live audio data to one or more user devices.

Architecture 700 can be implemented in a parallel processing or peer-to-peer infrastructure or on a single device with one or more processors. Software can include multiple software components or can be a single body of code.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, a browser-based web application, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor or a retina display device for displaying information to the user. The computer can have a touch surface input device (e.g., a touch screen) or a keyboard and a pointing device such as a mouse or a trackball by which the user can provide input to the computer. The computer can have a voice input device for receiving voice commands from the user.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of implementations of the invention have been described. Nevertheless, it will be understood that various modifications can be made without departing from the spirit and scope of the invention.

The invention claimed is:
1. A method comprising:
determining, by one or more processors, an amount of excess sibilance in an audio signal based on a comparison of an energy level in a sibilance band of the audio signal and a broadband energy level of the audio signal;
determining, by the one or more processors, an amount of attenuation to apply to the sibilance band to remove the excess sibilance, the amount of attenuation based on characteristics of a compression curve; and applying, by the one or more processors, the amount of attenuation to the sibilance band of the audio signal, wherein determining the amount of attenuation based on the compression curve further comprising:

dividing, one or more received audio signals into a series of buffers in time domain, each buffer including a plurality of samples of the one or more audio signals;

transforming each buffer into frequency domain; and for each buffer, determining a respective energy envelope, a respective sibilance energy level, and a respective zero-crossing rate.

2. The method of claim 1, further comprising:

modifying the amount of attenuation based on a zero-crossing rate.

3. The method of claim 1, further comprising:

providing the audio signal, with the excess sibilance removed in the sibilance band, to a consuming device for storage, streaming or playback.

4. The method of claim 1, applying the amount of attenuation further comprising:

applying gain reduction to a sibilance frequency band of a particular buffer among the series of buffers in response to determining that:

a ratio between a sibilance energy level of the particular buffer and an energy envelope of an immediate previous buffer satisfies a first threshold; and a zero-crossing rate of the particular buffer satisfies a second threshold.

5. The method of claim 4, wherein determining that the zero-crossing rate of the particular buffer satisfies the second threshold further comprises comparing the zero-crossing rate with the second threshold using a binary comparison.

6. The method of claim 4, further comprising determining a side-chain filter in the frequency domain, the side-chain filter having a magnitude of one in a corresponding sibilance frequency band and a magnitude of zero outside of the corresponding sibilance frequency band.

7. The method of claim 6, wherein the side-chain filter includes a ramp adjacent to the corresponding sibilance frequency band.

8. The method of claim 7, wherein the ramp is ⅓ octave.

9. The method of claim 6, wherein determining the respective sibilance energy level for each buffer comprises applying the side-chain filter to a respective buffer and determining an energy level of the respective buffer after filtering.

10. The method of claim 9, wherein determining the respective sibilance energy level for each buffer comprises multiplying the side-chain filter to the plurality of samples in the respective buffer in the frequency domain, and determining the energy level of the plurality of samples after the filtering.

11. The method of claim 1, wherein determining the respective energy envelope for each buffer comprises:

determining a total energy level of a respective buffer; and smoothing the total energy level into the respective energy envelope by applying a first order low-pass filter having a time constant that is based on whether the respective buffer is in an attack phase or a release phase.

12. The method of claim 11, wherein the total energy level is a sum of squares of amplitudes of the plurality of samples in the respective buffer.

13. The method of claim 1, wherein the characteristics of the compression curve include at least one of a slope or an onset of the compression curve.

14. A system comprising:

one or more processors; and a non-transitory computer-readable medium storing instructions that, when executed by the one or more processors, cause the one or more processors to perform operations comprising operations of claim 1.

15. A non-transitory computer-readable medium storing instructions that, when executed by one or more processors, cause the one or more processors to perform operations comprising operations of claim 1.

* * * * *

UNITED STATES PATENT AND TRADEMARK OFFICE
CERTIFICATE OF CORRECTION

| | |
|---|---|
| PATENT NO. | : 12,051,435 B2 |
| APPLICATION NO. | : 17/733397 |
| DATED | : July 30, 2024 |
| INVENTOR(S) | : Giulio Cengarle et al. |

It is certified that error appears in the above-identified patent and that said Letters Patent is hereby corrected as shown below:

In the Claims

Column 11, Line 34, In Claim 6, delete "claim 4," and insert --claim 1,--

Signed and Sealed this
Twelfth Day of November, 2024

Katherine Kelly Vidal
*Director of the United States Patent and Trademark Office*